(12) United States Patent
Kuczynski et al.

(10) Patent No.: US 8,373,959 B2
(45) Date of Patent: Feb. 12, 2013

(54) DETECTING AND PREVENTING OVERHEATING IN POWER CONNECTORS

(75) Inventors: Joseph Kuczynski, Rochester, MN (US); Melissa K. Miller, Durham, NC (US); Heidi Williams, Cary, NC (US); Jing Zhang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 827 days.

(21) Appl. No.: 12/555,583

(22) Filed: Sep. 8, 2009

(65) Prior Publication Data

US 2011/0058298 A1    Mar. 10, 2011

(51) Int. Cl.
*H02H 5/04* (2006.01)
(52) U.S. Cl. .......................................................... 361/103
(58) Field of Classification Search .................... 361/103
See application file for complete search history.

(56) References Cited

U.S. PATENT DOCUMENTS

| | | | |
|---|---|---|---|
| 4,553,852 A | 11/1985 | Derderian et al. | |
| 4,577,976 A | 3/1986 | Hayashi et al. | |
| 4,945,770 A | 8/1990 | Alvelid et al. | |
| 6,049,143 A | 4/2000 | Simpson et al. | |
| 6,139,361 A * | 10/2000 | Przilas et al. | 439/559 |
| 7,362,011 B2 | 4/2008 | Komatsu et al. | |
| 7,441,173 B2 | 10/2008 | Restrepo et al. | |

FOREIGN PATENT DOCUMENTS

JP           60201224 A      10/1985

OTHER PUBLICATIONS

Fralick, Gus, "Thin Film Heat Flux Sensor of Improved Design", NASA/TM-2002-211566, Sep. 2002, http://gltrs.grc.nasa.gov, 14 pages.

* cited by examiner

*Primary Examiner* — Dharti Patel
(74) *Attorney, Agent, or Firm* — Cynthia G. Seal; Jeffrey L. Streets

(57) ABSTRACT

A method and apparatus directed to detecting and preventing excessive heating in power connectors is disclosed. In one embodiment, a system includes a power connector having an array of pins. A circuit board, such as a midplane of a blade server chassis, has an array of electrical vias passing through the circuit board that are arranged to receive the array of pins and at least one heat flux sensor positioned on one of the vias at the back of the midplane. The heat flux sensor is configured for generating an electrical signal in relation to an applied heat flux. A controller in communication with the heat flux sensor is configured for powering off the electrical power supply in response to the electrical signal reaching a setpoint corresponding to a selected heat flux threshold.

15 Claims, 3 Drawing Sheets

DETECTING AND PREVENTING OVERHEATING IN POWER CONNECTORS

BACKGROUND

1. Field of the Invention

The present invention relates to detecting and preventing overheating in electronic systems, and particularly in the vicinity of power connectors on circuit boards.

2. Background of the Related Art

Electrical connectors are used to transfer data and/or power signals between components in computer systems. Power connectors, specifically, are used to make power connections to components in computer systems. A power connector commonly includes a plurality of compliant pins on the back of the connector for assembling the power connector to a printed circuit board (PCB), such as a motherboard in a PC or server, or a midplane or backplane in the chassis of a blade server system. The power connector may be assembled to the PCB by inserting compliant pins on the power connector into plated through-holes (vias) on the PCB. The power connector also typically includes exposed pins or receptacles that are used to connect with a mating power connector on a component to be connected. Electrical power is transferred along electrical pathways on the PCB from a power source to the compliant pins, from the compliant pins to the exposed pins or receptacles, and from the exposed pins or receptacles to the mating connector on the connected component, for supplying power to the connected component.

A blade server system is one example of a computer system that uses numerous power connectors to supply power from a power module to multiple servers in a high-density arrangement. A relatively large amount of power is distributed from the power supply to the servers. Overcurrent protection is commonly provided in a blade server system. However, although uncommon, a defective connection between the power connector and the PCB could cause a sudden and unexpected temperature increase that could damage the power connector and surrounding components before typical overcurrent protection would respond. For example, a bent, buckled, or otherwise damaged pin in the vicinity of the corresponding plated-through hole of a PCB could cause high contact stresses or high contact resistance in the vicinity of the plated through-hole. A fracture in the laminate around the plated-through hole is another example of a defect, which could lead to a short-circuit.

BRIEF SUMMARY

One embodiment of the present invention provides a system, including a power connector, a circuit board, at least one heat flux sensor, and a controller. The power connector has an array of pins. The circuit board has a first face, an opposing second face, an array of electrical vias passing through the circuit board from the first face to the second face and arranged to receive the array of pins into the vias from the first face, and a trace for supplying electrical power to the vias. The heat flux sensor is positioned along the opposing second face in alignment with one of the vias. The heat flux sensor is configured for generating an electrical signal in relation to an applied heat flux. The controller is in electronic communication with the heat flux sensor and is configured for powering off the supply of electrical power through the power connector in response to the electrical signal reaching a setpoint corresponding to a selected heat flux threshold.

Another embodiment provides a method. Electrical power is supplied to a via on a circuit board. A time-rate of change of heat flux at the power via is sensed. A signal is generated in response to the time-rate of change of heat flux exceeding a selected heat flux threshold. The supply of electrical power from the power via is stopped in response to the signal.

DETAILED DESCRIPTION

The present invention includes apparatus and method embodiments directed to detecting and responding to sudden and unexpected temperature increases in the vicinity of power connections. In one embodiment, a heat flux sensor is positioned in thermal contact with a power via and possibly a ground via on the side of a PCB opposite a power connector. The PCB has a plurality of vias comprising plated through-holes that receive compliant pins of the power connector. The heat flux sensor includes a bridge circuit, such as a Wheatstone bridge circuit, having four arms. Each arm includes a circuit element with a variable electrical resistance having a well-characterized variance with temperature. A thermally-resistive material is applied to two opposing arms. A DC current is applied to the bridge circuit, with a characteristic electrical response in the presence of an applied heat flux. The electrical response may be indicated by a voltage measured across the bridge circuit. The voltage is used as an indication of the heat flux. In one embodiment, the time-derivative of the heat-flux is monitored and, once it reaches a threshold value, a signal is sent from a controller to a service processor to automatically shut off power to the power connector before damage can occur.

Figure 1:
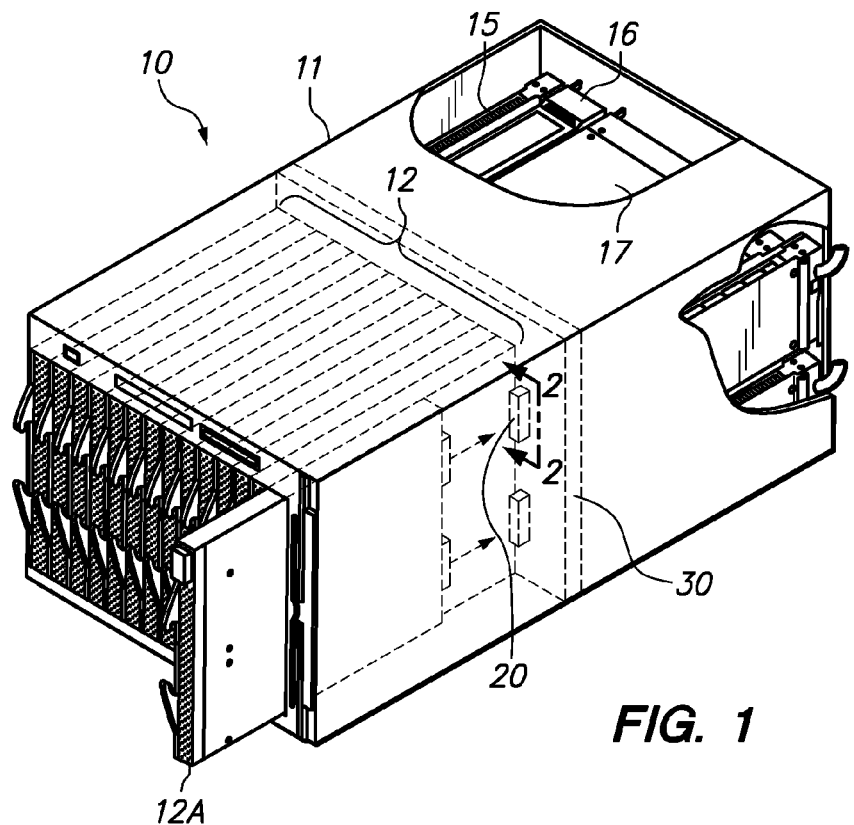
FIG. 1 is a perspective view of an example blade server system including a plurality of blade servers removably installed in a rack-mountable blade server chassis.

FIG. 1 is a perspective view of an example blade server system 10 including a plurality of blade servers 12 removably installed in a rack-mountable blade server chassis 11. The blade server chassis 11 has, by way of example, fourteen server bays for receiving fourteen blade servers 12. The blade servers 12 share system resources such as power, cooling, and network connectivity provided by various chassis support modules. The chassis support modules include at least one each of a chassis management module 15, a power supply module 16, and a blower module 17. The management module 15 manages the hardware installed in the chassis 11, including the blade servers 12, power supply module 16, and blower module 17. The power module 16 provides electrical power to all of the blade servers 12. The blower module 17 generates airflow through the chassis 11 to remove the heat generated by each of the servers 12 and support modules. The blade servers 12 and support modules 15-17 interface with one another within the blade server chassis 11 by virtue of their connection with a chassis midplane 30. The midplane 30 is a printed circuit board (PCB) having rigid connectors at each chassis bay for the servers 12 to blind-dock. One of the blade servers 12A is shown only partially inserted within its bay, to reveal two rigid power connectors 20 formed on the midplane 30 in a position aligned for blind-docking the server 12A. The remaining thirteen blade servers 12 are shown fully inserted and are docked to their respective connectors (not shown).

Figure 2:
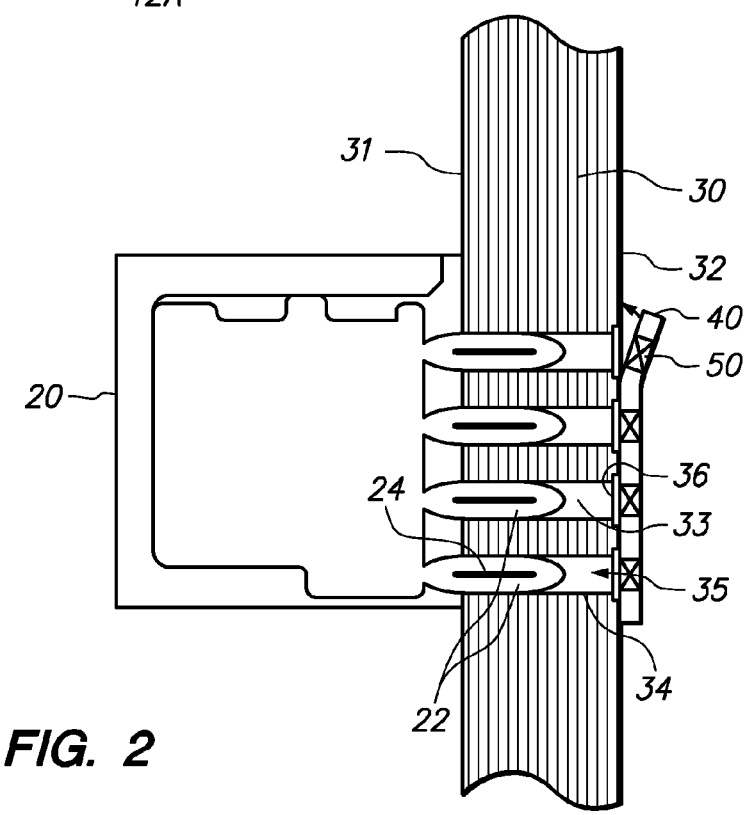
FIG. 2 is a sectioned view of a rigid power connector as assembled to a midplane, taken at the sectioning plane and in the direction indicated by section lines 2-2 in FIG. 1.

FIG. 2 is a sectioned view of the rigid power connector 20 assembled onto the midplane 30, taken at the sectioning plane and in the direction indicated by section lines 2-2 in FIG. 1. The rigid power connector 20 includes a plurality of compliant pins 22. The midplane 30 has a plurality of vias 34 for receiving the compliant pins 22. Vias, generally, are plated through-holes whose uses include making electrical connections between different layers of a PCB, such as between traces on one plane of the PCB with traces on another layer of the PCB. Here, the vias 34 include through holes 35 that pass through the midplane 30 from a first surface 31 to an opposing second surface (referred to as the "backside" in this embodiment) 32. An electrically conductive material layer 33 may be formed in the through-holes 35 by electroplating, or by filling the through-holes 35 with annular rings or rivets. The vias 34 include pads 36 that are exposed at the second surface 32. The pads 36 may be formed together with the electrically conductive material layer 33 using methods generally known in the art, such as by electroplating and/or etching.

When assembling the power connector 20 onto the midplane 30, the compliant pins 22 are inserted into the vias 34. The compliant pins 22 have an interference fit with the vias 34 to electrically contact the electrically conductive material layer 33. A slight separation 24 is provided between two sides of the compliant pin 22. The separation 24 allows inward flexure of each pin 22 to facilitate insertion into the vias 34. However, if handled incorrectly, the compliant pins 22 may occasionally buckle (not shown) upon insertion. Buckling of the pins may cause a high contact resistance between the compliant pins 22 and the vias 34. High contact resistance can lead to excessive heat generation and accompanying damage to the power connector 20 and/or midplane 30. Another source of potential failure of the connection is glass fracturing in the laminate around the vias 34 causing a short-circuiting between power and ground. A large current in the context of one of these two failure scenarios may cause damage before power shuts down (e.g. with a circuit breaker).

A sensor module 40 is therefore provided for detecting excessive heating in and around the power connector 20. The sensor module 40 comprises a substrate, which may be a thin, optionally-flexible film, carrying a plurality of heat-flux sensors 50. The film comprises a thermally-resistive, organic material, such as a polyester or polyphenylene ether material. The sensor module 40 is adhered to the backside 32 of the midplane 30, which is on the side of the midplane 30 opposite the power connector 20. The heat flux sensors 50 are spaced along the flexible film to make thermal contact with the exposed pads 36 of the vias 34. As discussed further below, the heat flux sensors 50 can be used to detect excessive heating at the pads 36. Damage due to overheating may be avoided by shutting down power to the power connector 20 in response to detection of excessive heating.

Figure 3:
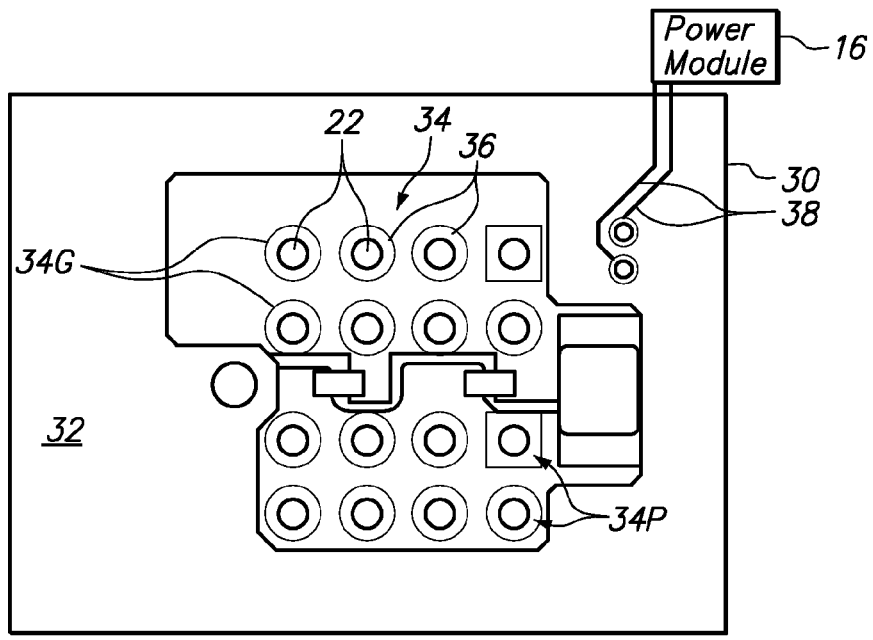
FIG. 3 is a view of the backside of the midplane, showing an array of vias provided for the power connector of FIG. 2.

FIG. 3 is a view of the backside 32 of the midplane 30, which shows the array of vias 34 provided for the power connector 20 of FIG. 2. A total of sixteen vias 34 are included for interfacing with the power connector 20 of FIG. 2, including eight power vias 34P and eight ground vias 34G. The ends of compliant pins 22 are visible, as received within the vias 34. The power vias 34P are electrically energized by power supplied to the midplane 30 by the power supply module 16. The electrically energized power vias 34P transmit electrical power to the corresponding compliant pins 22. Power is provided to the blade server 12 (see FIG. 1) by the connector pins 22 within the power vias 34P and a ground connection is provided to the blade server 12 by the connector pins 22 within the ground vias 34G. Some of the power may be transferred to or from the vias 34P along electrical traces on or within the midplane 30, such as along traces 38 and other traces hidden within other layers of the midplane 30.

Figure 4:
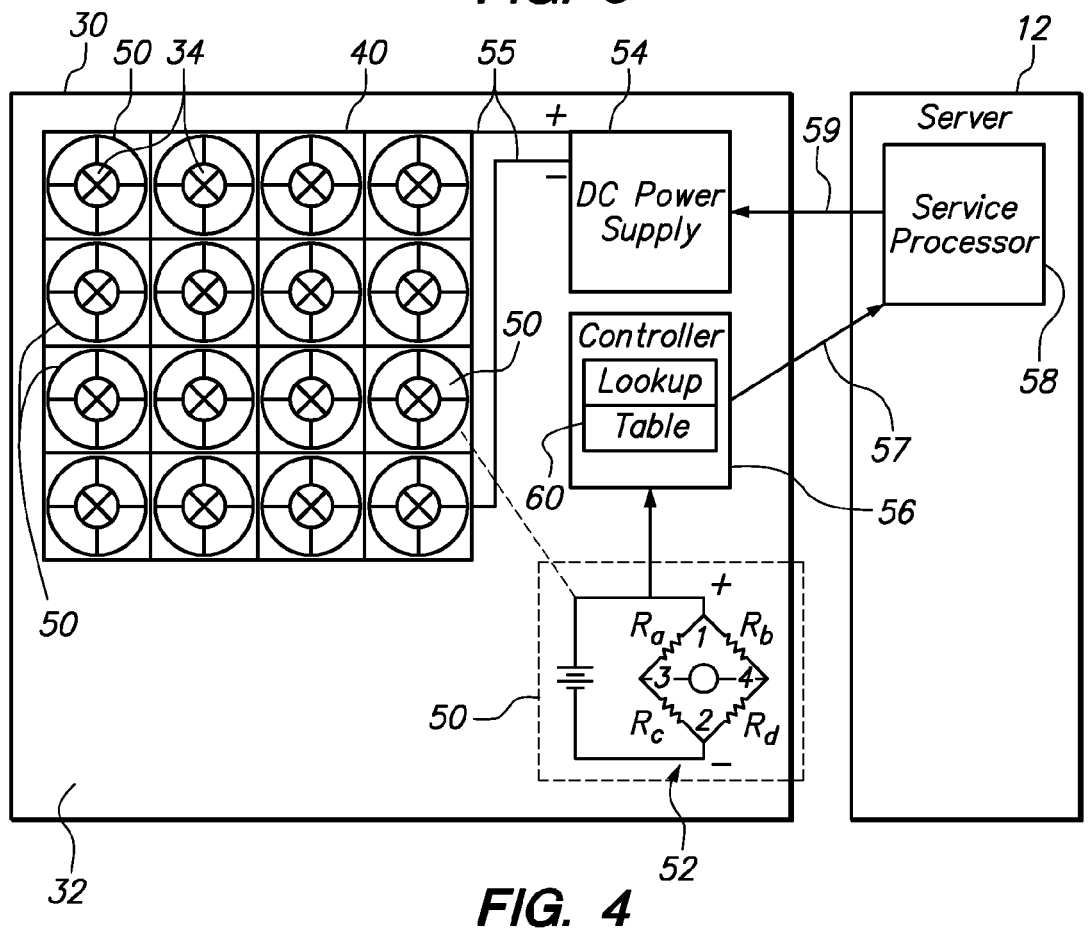
FIG. 4 is a schematic diagram of a system for detecting and responding to potential overheating in the vicinity of the power connector.

FIG. 4 is a schematic diagram of a system for detecting and responding to potential overheating in the vicinity of the power connector 20 shown in FIG. 2. The sensor module 40 is placed on the backside 32 of the midplane 30 over the array of vias 34. The sensor module 40 may be secured to the midplane 30 by a pressure-sensitive adhesive layer applied to one side of the sensor module. The heat flux sensors 50 have the same relative positioning, such as size and spacing, along the sensor module 40 as the array of vias 34 along the midplane 30, so that each individual heat flux sensor 50 is aligned with one via 34 in the array of vias. Accordingly, each heat flux sensor 50 is in thermal contact with the respective via 34 so that heat from each via 34 is detected by the respective heat flux sensor 50. The corresponding heat flux is generally in a direction perpendicular to the plane of the midplane 30.

A DC power supply 54 supplies DC power to the flux sensors 50. The DC power supply 54 may receive power from the power supply module 16 (see FIG. 3), and may include an inverter (not shown) for converting alternating current (AC) to direct current (DC). The DC power is supplied along a pair of electrical leads 55 to each heat flux sensor 50 using a parallel circuit. To simplify the illustration, only one pair of electrical leads 55 is shown extending to one of the heat flux sensors 50, although one skilled in the art will appreciate that a similar pair of electrical leads 55 may be provided to each heat flux sensor 50 along electrical pathways, such as traces etched on the sensor module 40.

Each heat flux sensor 50 in this embodiment incorporates a bridge circuit schematically shown at 52. The bridge circuit 52 is, more particularly, a Wheatstone bridge circuit, which is a type of bridge circuit known generally in the art apart from its application in the present invention. Examples of heat flux sensors incorporating Wheatstone bridge circuits are taught in "Thin Film Heat Flux Sensor of Improved Design" (NASA/TM-2002-211566). The bridge circuit 52 includes two circuit elements Ra and Rb connected at a first node (node "1") and two circuit elements Rc and Rd connected at a second node (node "2") opposite node 1. Circuit element Ra is coupled to circuit element Rc at a third node (node "3") and circuit element Rb is coupled to circuit element Rd at a fourth node (node "4"). The positive one of the two electrical leads 55 is coupled to node 1 and the negative one of the two electrical leads 55 is coupled to node 2. The DC power supplied to the bridge circuit 52 flows in parallel along two diverging circuit elements Ra and Rb, and is recombined along two converging circuit elements Rc and Rd. With reference to the flow through the bridge circuit 52, circuit elements Ra and Rb are referred to herein as "diverging" circuit elements Ra and Rb, because they diverge from node 1. Likewise, circuit elements Rc and Rd are referred to herein as "converging" circuit elements because they converge to node 2. The circuit elements Ra, Rb, Rc, and Rd each have an electrical resistance that varies with temperature. The variance of the electrical resistance as a function of temperature for each circuit element is well known.

As further explained below, two of the circuit elements Ra, Rb, Rc, and Rd are covered with an additional thermally-resistive material. Typically, the additional thermally-resistive material is applied to two circuit elements on opposing bridge arms, such as to circuit elements Ra and Rd or to circuit elements Rb and Rc. As a consequence, when a uniform heat flux is applied in a direction perpendicular to the plane of the heat flux sensor 50, the circuit elements having the additional thermal resistance experience a slower increase in temperature than the other two circuit elements. The difference in the rate of heating among the circuit elements causes variations in the temperature-dependent electrical resistance of the circuit elements. The effects of the changing relationship between the electrical resistance of the circuit elements Ra-Rd can be interpreted by applying conventional circuit mathematics to voltage measurements taken in the bridge circuit 52, and more particularly the voltage difference between nodes 3 and 4. The incident heat flux can be correlated with the electrical behavior of the bridge circuit 52 in response to the applied heat flux. The correlation can be used to identify excessive heating in the connector based on voltage measurements.

A controller 56 is provided for monitoring the bridge circuit 52. The controller 56 may be an application-specific integrated circuit (ASIC) provided on the midplane 30. The controller 56 monitors voltage changes occurring within the bridge circuit 52 as a result of changing temperature-dependent electrical resistance values, such as between node 3 where circuit elements Ra and Rc meet and node 4 where circuit elements Rb and Rd meet. These voltage measurements may be interpreted by the controller 56 to determine the time-derivative of the heat flux passing through the heat flux sensor 50 at the via 34. In response to the voltage measurements reaching a preset limit, power is cut off to the connector associated with the sensor module 40. In one example, a setpoint value of the time-rate of change of voltage that corresponds to a threshold level of heat flux is provided in a lookup table 60. When the time derivative of the heat flux reaches the threshold level of heat flux, as indicated by reaching the voltage setpoint, the controller 56 generates a power-off signal 57. The power-off signal 57 may be sent to a service processor 58 residing on the server 12 that is coupled to the connector associated with the sensor module 40. In response to receiving the power-off signal 57 from the controller 56, the service processor 58 generates a corresponding signal to power-off the DC power supply 54 or that portion of the power supply output to the associated server 12. The generation of the power-off signal and the powering-off of the DC power supply 54 may happen very quickly, before a dangerously high heat flux causes damage to the power connector.

Figure 5:
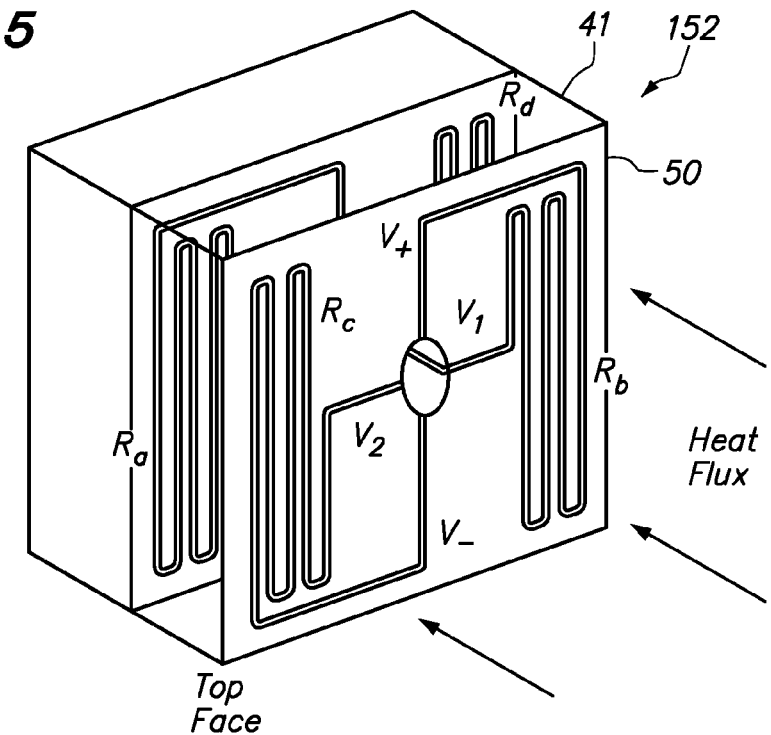
FIG. 5 is a perspective schematic view of the heat flux sensor incorporating a double-sided, thin-film Wheatstone bridge circuit, as positioned over a via.

FIG. 5 is a perspective schematic view of the heat flux sensor incorporating a double-sided, thin-film Wheatstone bridge circuit 152. Circuit elements Ra, Rb, Rc, and Rd are provided along four active arms of the Wheatstone bridge circuit 152. Each circuit element Ra-Rd may be, for example, sputter-deposited platinum, which has favorable high-temperature properties and a well characterized variation of electrical resistance with temperature. The circuit elements Ra-Rd are provided on a substrate 41, which is shown here as transparent only for the purpose of illustrating the circuit. The substrate 41 may be, for example, an alumina substrate. The circuit elements Ra-Rd may be formed using photolithographic techniques known in the art. A heat flux direction is indicated using arrows. Circuit elements Ra and Rd are embedded in the substrate 41 at a greater depth (relative to the direction of the heat flux) than circuit elements Rb and Rc. The substrate 41 provides an additional thermal resistance to circuit elements Ra and Rd. Each of circuit elements Ra-Rd has substantially the same electrical resistance when at the same temperature, such as when the circuit elements Ra-Rd are all at ambient temperature. However, the additional thermal resistance over circuit elements Ra and Rd causes the circuit elements Ra and Rd to heat more slowly than circuit elements Rb and Rc in the presence of the heat flux. Due to the temperature-dependent electrical resistance of the circuit elements Ra-Rd, the heat flux can be correlated with the electrical behavior of the bridge circuit, and voltage measurements can be used to ascertain the magnitude of the heat flux.

Figure 6:
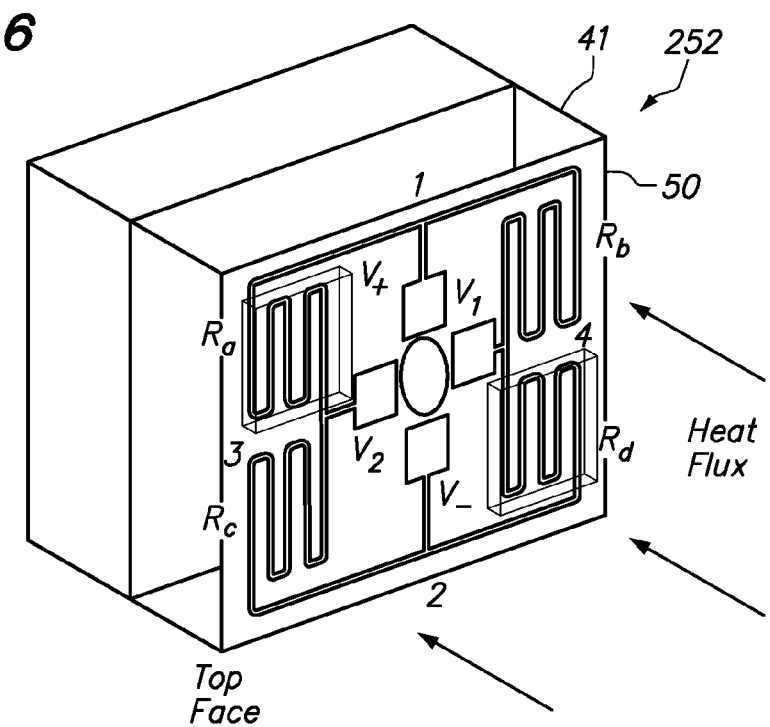
FIG. 6 is another perspective schematic view of the heat flux sensor incorporating an alternative, single-sided, thin-film Wheatstone bridge circuit, as positioned over a via.

FIG. 6 is another perspective schematic view of the heat flux sensor 50 incorporating an alternative, single-sided, thin-film Wheatstone bridge circuit 252. Circuit elements Ra, Rb, Rc, and Rd are provided along four active arms of the Wheatstone bridge circuit 252. Here, all of the circuit elements Ra-Rd are at substantially the same depth (or on the surface) of the substrate 41, and additional thermal resistance is instead deposited on circuit elements Ra and Rd. A heat flux direction is indicated using arrows. Again, the additional thermal resistance over circuit elements Ra and Rd causes the circuit elements Ra and Rd to heat more slowly than circuit elements Rb and Rc in the presence of the heat flux. Due to the temperature-dependent electrical resistance of the circuit elements Ra-Rd, the heat flux can be correlated with the electrical behavior of the bridge circuit, and voltage measurements can be used to ascertain the magnitude of the heat flux.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:
1. A system, comprising:
a power connector having an array of pins;
a circuit board having a first face, an opposing second face, an array of electrical vias passing through the circuit board from the first face to the second face and arranged to receive the array of pins into the vias from the first face, and a trace for supplying electrical power to the vias;

at least one heat flux sensor positioned along the opposing second face in alignment with one of the vias, the at least one heat flux sensor configured for generating an electrical signal in relation to an applied heat flux; and a controller in electronic communication with the heat flux sensor and configured for powering off the supply of electrical power through the power connector in response to the electrical signal reaching a setpoint corresponding to a selected heat flux threshold.

2. The system of claim 1, wherein the heat flux sensor further comprises:

a bridge circuit, the bridge circuit including two diverging circuit elements coupled at a first node and two converging circuit elements coupled at a second node opposite the first node, with one of the diverging circuit elements coupled to one of the converging circuit elements at a third node and the other diverging circuit element coupled to the other converging circuit element at a fourth node opposite the third node;

wherein the diverging circuit element between the first and third nodes and the converging circuit element between the second and fourth nodes has an equal and higher thermal resistance than the other diverging circuit element and converging circuit element;

a DC power source including a positive DC terminal coupled to the first node between the diverging circuit elements and a negative DC terminal coupled to the second node between the converging circuit elements; and wherein the controller is configured to power off the electrical power supply in response to the voltage between the third and fourth nodes reaching a voltage setpoint corresponding to the selected heat flux threshold.

3. The apparatus of claim 2, further comprising a substrate included with the heat flux sensor, wherein the diverging and converging circuit elements are arranged at the same depth within the substrate, with a thermally-resistive material applied to one of the diverging circuit elements and an opposing one of the converging circuit elements but not to the other diverging element and other converging circuit element.

4. The apparatus of claim 2, further comprising a thermally-resistive substrate included with the heat flux sensor, wherein one of the diverging circuit elements and an opposing one of the circuit elements are at a first depth and the other diverging circuit element and other converging circuit element are at a second depth within the thermally-resistive substrate.

5. The apparatus of claim 4, wherein the thermally-resistive substrate comprises an organic film.

6. The apparatus of claim 2, wherein the bridge circuit comprises a Wheatstone bridge circuit.

7. The apparatus of claim 1, wherein the diverging and converging circuit elements each comprise sputter-deposited platinum traces disposed on a substrate.

8. The apparatus of claim 1, further comprising:

a flexible film carrying an array of the heat flux sensors, with a relative positioning of the heat flux sensors along the flexible film matching a relative positioning of the electrical vias along the circuit board, wherein the flexible film is adhered to the second face of the circuit board with the array of heat flux sensors in one-to-one contact with the array of vias.

9. The apparatus of claim 1, further comprising a service processor in electronic communication with the electrical power supply and the controller, wherein the controller is configured to generate a power-off signal to the service processor and the service processor is configured to power-off the electrical power supply in response to receiving the power-off signal.

10. The apparatus of claim 1, wherein the vias include a power via and a ground via and the at least one heat flux sensor includes a first heat flux sensor coupled to the power via and a second heat flux sensor coupled to the ground via.

11. The apparatus of claim 1, wherein the circuit board comprises a midplane or a backplane of a multi-blade chassis.

12. A method, comprising:

supplying electrical power to a via on a circuit board;

sensing a time-rate of change of heat flux at the power via;

generating a signal in response to the time-rate of change of heat flux exceeding a selected heat flux threshold; and stopping the supplying of electrical power from the power via in response to the signal.

13. The method of claim 12, further comprising:

applying the heat flux uniformly to a bridge circuit having four circuit elements, each circuit element having a known variation of electrical resistance with temperature; and resisting the flow of the heat flux through two opposing circuit elements of the bridge circuit such that the other two circuit elements heat more rapidly in response to the applied heat flux; and generating the signal in response to a voltage of the bridge circuit reaching a setpoint value associated with the heat flux threshold.

14. The method of claim 13, further comprising:

determining the setpoint value by applying heat flux at a magnitude of the heat-flux threshold to the power via; and recording a voltage response across the bridge circuit in response to application of the heat-flux at the magnitude of the heat-flux threshold.

15. The method of claim 13, further comprising:

storing the setpoint value in an electronic lookup table; and referencing the lookup table to dynamically compare the signal with the setpoint value.

* * * * *